United States Patent
Takasu et al.

(10) Patent No.: US 11,927,706 B2
(45) Date of Patent: Mar. 12, 2024

(54) RADIATION DETECTOR

(71) Applicant: KABUSHIKI KAISHA TOSHIBA, Tokyo (JP)

(72) Inventors: Isao Takasu, Setagaya (JP); Kohei Nakayama, Kawasaki (JP); Atsushi Wada, Kawasaki (JP); Fumihiko Aiga, Kawasaki (JP); Yuko Nomura, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 372 days.

(21) Appl. No.: 17/184,733

(22) Filed: Feb. 25, 2021

(65) Prior Publication Data
US 2022/0082715 A1 Mar. 17, 2022

(30) Foreign Application Priority Data
Sep. 14, 2020 (JP) ............................... 2020-153897

(51) Int. Cl.
*G01T 1/20* (2006.01)
*G01T 1/24* (2006.01)
*H10K 39/36* (2023.01)

(52) U.S. Cl.
CPC ............ *G01T 1/20184* (2020.05); *G01T 1/20* (2013.01); *G01T 1/24* (2013.01); *H10K 39/36* (2023.02)

(58) Field of Classification Search
CPC ......... G01T 1/20; G01T 1/20184; G01T 1/24; H10K 39/36
See application file for complete search history.

(56) References Cited

U.S. PATENT DOCUMENTS 10,444,166 B2 * 10/2019 Onishi .................. G01N 23/18

FOREIGN PATENT DOCUMENTS

| JP | 2009-259978 A | 11/2009 |
| JP | 2011-145292 A | 7/2011 |
| JP | 2015-4551 A | 1/2015 |
| JP | 2017-116283 A | 6/2017 |

OTHER PUBLICATIONS

Tachibana et al., "Development of Automated Measurement Device for Low-level Radioactive Contamination on Building Surfaces", Transactions of the Atomic Energy Society of Japan vol. 3, No. 1, 2004, 40 pages.

* cited by examiner

*Primary Examiner* — Mark R Gaworecki
(74) *Attorney, Agent, or Firm* — Oblon, McClelland, Maier & Neustadt, L.L.P.

(57) ABSTRACT

According to one embodiment, a radiation detector includes a base body, a first radiation detection element, and a second radiation detection element. The base body includes a first surface. The first surface includes first and second partial regions. A first direction from the first partial region toward the second partial region is along the first surface. The first radiation detection element is fixable to the first partial region. The second radiation detection element includes a first detecting part fixable to the second partial region. The first detecting part includes first and second end portions. A second direction from the first end portion toward the second end portion crosses the first surface. The second end portion is between the first end portion and the second partial region in the second direction. The first radiation detection element does not overlap the first end portion in the first direction.

18 Claims, 5 Drawing Sheets

RADIATION DETECTOR

CROSS-REFERENCE TO RELATED APPLICATIONS

This application is based upon and claims the benefit of priority from Japanese Patent Application No. 2020-153897, filed on Sep. 14, 2020; the entire contents of which are incorporated herein by reference.

FIELD

Embodiments described herein relate generally to a radiation detector.

BACKGROUND

For example, contamination due to radioactivity or the like can be detected by a radiation detector. More accurate detection is desirable.

DETAILED DESCRIPTION

Figure 1A:
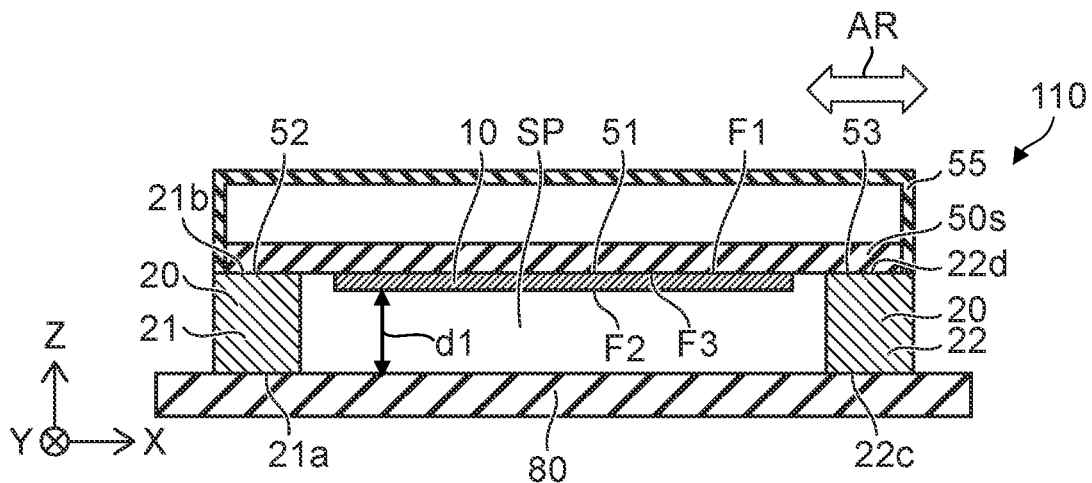
FIGS. 1A and 1B are schematic views illustrating a radiation detector according to a first embodiment.

According to one embodiment, a radiation detector includes a base body, a first radiation detection element, and a second radiation detection element. The base body includes a first surface. The first surface includes a first partial region and a second partial region. A first direction from the first partial region toward the second partial region is along the first surface. The first radiation detection element is fixable to the first partial region. The second radiation detection element includes a first detecting part fixable to the second partial region. The first detecting part includes a first end portion and a second end portion. A second direction from the first end portion toward the second end portion crosses the first surface. The second end portion is between the first end portion and the second partial region in the second direction. The first radiation detection element does not overlap the first end portion in the first direction.

According to one embodiment, a radiation detector includes a first conductive member, a second conductive member, and an organic semiconductor layer. The first conductive member is located around the second conductive member. The organic semiconductor layer is provided between the first conductive member and the second conductive member.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
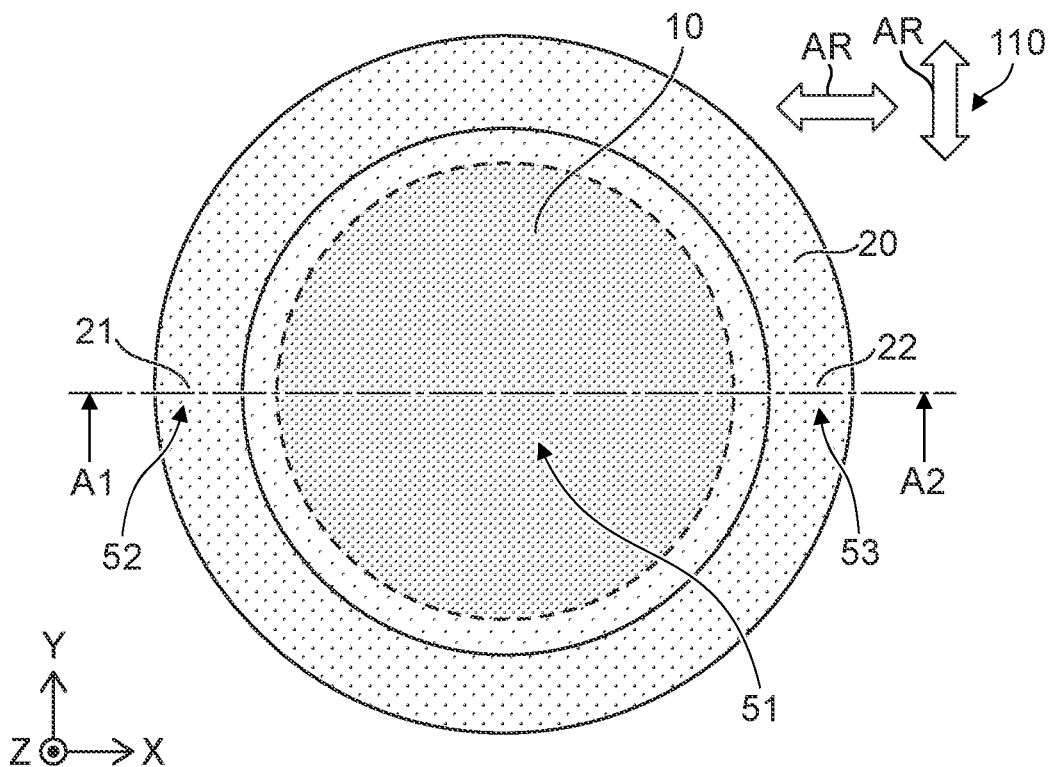

FIGS. 1A and 1B are schematic views illustrating a radiation detector according to a first embodiment.

FIG. 1A is a line A1-A2 cross-sectional view of FIG. 1B. FIG. 1B is a plan view. In FIG. 1B, some of the components included in the radiation detector are not illustrated for easier viewing of the drawing.

As shown in FIGS. 1A and 1B, the radiation detector 110 according to the embodiment includes a base body 50s, a first radiation detection element 10, and a second radiation detection element 20. As shown in FIG. 1A, the radiation detector 110 may include a housing 55. For example, at least a portion of the base body 50s may be located inside the housing 55.

The base body 50s includes a first surface F1. The first surface F1 is, for example, a lower surface. The first surface F1 includes a first partial region 51 and a second partial region 52. A first direction from the first partial region 51 toward the second partial region 52 is along the first surface F1.

A direction perpendicular to the first surface F1 is taken as a Z-axis direction. One direction perpendicular to the Z-axis direction is taken as an X-axis direction. A direction perpendicular to the Z-axis direction and the X-axis direction is taken as a Y-axis direction. For example, the first surface F1 is along the X-Y plane. The first direction is, for example, the X-axis direction.

As shown in FIG. 1A, the first radiation detection element 10 is fixable to the first partial region 51. In the example, the first radiation detection element 10 is fixed to the first partial region 51.

The second radiation detection element 20 includes a first detecting part 21. The first detecting part 21 is fixable to the second partial region 52. In the example, the first detecting part 21 is fixed to the second partial region 52.

As shown in FIG. 1A, the first detecting part 21 includes a first end portion 21a and a second end portion 21b. A second direction from the first end portion 21a toward the second end portion 21b crosses the first surface F1. The second direction is, for example, the Z-axis direction. The second end portion 21b is between the first end portion 21a and the second partial region 52 in the second direction (the Z-axis direction).

According to the embodiment, the first radiation detection element 10 does not overlap the first end portion 21a in the first direction (the X-axis direction).

For example, the first radiation detection element 10 is recessed in the second direction (the Z-axis direction) when referenced to the first end portion 21a. For example, the first end portion 21a protrudes more than the first radiation detection element 10 when referenced to the base body 50s. A space SP is under the first radiation detection element 10.

For example, the radiation detector 110 detects radiation from an object 80. The radiation includes, for example, β-rays, etc. For example, the radiation from the object 80 can be detected by the first radiation detection element 10 by causing the first end portion 21a to contact the object 80. By causing the first end portion 21a to contact the object 80, the height of the space SP between the object 80 and the first radiation detection element 10 is stably fixed. For example, the second radiation detection element 20 can function as a spacer that stabilizes the distance.

The detection may be performed by modifying the relative position between the object 80 and the radiation detector 110 along a plane parallel to the first surface F1 as shown by arrows AR in FIGS. 1A and 1B.

When a radioactive substance is adhered to the object 80, there are cases where the radioactive substance is transferred to the first end portion 21a when the first end portion 21a is caused to contact the object 80. When the radioactive substance is transferred to the first end portion 21a, there are cases where the radioactive substance of the first end portion 21a is transferred to other locations. The radioactive substance is diffused by the transfer, etc. In such a case, it is difficult to appropriately detect the radioactivity of the object 80.

According to the embodiment, the second radiation detection element 20 is provided. The radioactive substance that is adhered to the first end portion 21a can be detected by the second radiation detection element 20. For example, when the radiation that is detected by the second radiation detection element 20 is greater than a threshold, the radioactive substance that is adhered to the first end portion 21a may be removed by cleaning the first end portion 21a. Or, when the radiation that is detected by the second radiation detection element 20 is greater than the threshold, the second radiation detection element 20 may be replaced.

According to the embodiment, for example, the diffusion of the radioactive substance can be suppressed. According to the embodiment, a radiation detector can be provided in which more accurate detection is possible.

According to the embodiment, the second radiation detection element 20 may be detachable from the base body 50s. The second radiation detection element 20 can be easily replaced when the second radiation detection element 20 is contaminated.

According to the embodiment, the height of the first detecting part 21 is appropriately set. For example, as shown in FIG. 1A, the first radiation detection element 10 includes a second surface F2 and a third surface F3. The third surface F3 is between the second surface F2 and the first partial region 51. The third surface F3 faces the first partial region 51. The second surface F2 is at the side opposite to the third surface F3.

As shown in FIG. 1A, the distance along the second direction between the position of the first end portion 21a in the second direction (the Z-axis direction) and the position of the second surface F2 in the second direction is taken as a distance d1. According to the embodiment, the distance d1 is not less than 2 mm and not more than 30 mm. Due to such a distance, for example, the 0-rays from the object 80 can be relatively accurately detected. The distance d1 may be determined according to various standards, etc. For example, in one example, the distance d1 is 5 mm (not less than 4.5 mm and not more than 5.5 mm).

According to the embodiment, when the size of the first detecting part 21 is sufficiently large, the distance between the object 80 and the first radiation detection element 10 is stabilized merely by providing the first detecting part 21.

The distance is further stabilized by providing another detecting part other than the first detecting part 21.

In the example as shown in FIGS. 1A and 1B, the base body 50s further includes a third partial region 53. The second radiation detection element 20 further includes a second detecting part 22. The second detecting part 22 is fixable to the third partial region 53. In the example, the second detecting part 22 is fixed to the third partial region 53. The second detecting part 22 includes a third end portion 22c and a fourth end portion 22d. The direction from the third end portion 22c toward the fourth end portion 22d is along the second direction (the Z-axis direction). The fourth end portion 22d is between the third end portion 22c and the third partial region 53 in the second direction (the Z-axis direction).

The first radiation detection element 10 does not overlap the third end portion 22c in the first direction (the X-axis direction). By providing the first end portion 21a and the third end portion 22c, the distance between the object 80 and the first radiation detection element is further stabilized when these end portions contact the object 80. The second detecting part 22 also can function as a spacer.

In the example, the first partial region 51 is between the second partial region 52 and the third partial region 53 in the first direction (the X-axis direction). The position in the first direction of the first radiation detection element 10 is between the position in the X-axis direction of the first detecting part 21 and the position in the X-axis direction of the second detecting part 22.

In the example as shown in FIG. 1B, the second detecting part 22 is continuous with the first detecting part 21. As in the example shown in FIG. 1B, the second radiation detection element 20 may have a ring shape having the second direction (the Z-axis direction) as the central axis.

Figure 2A:
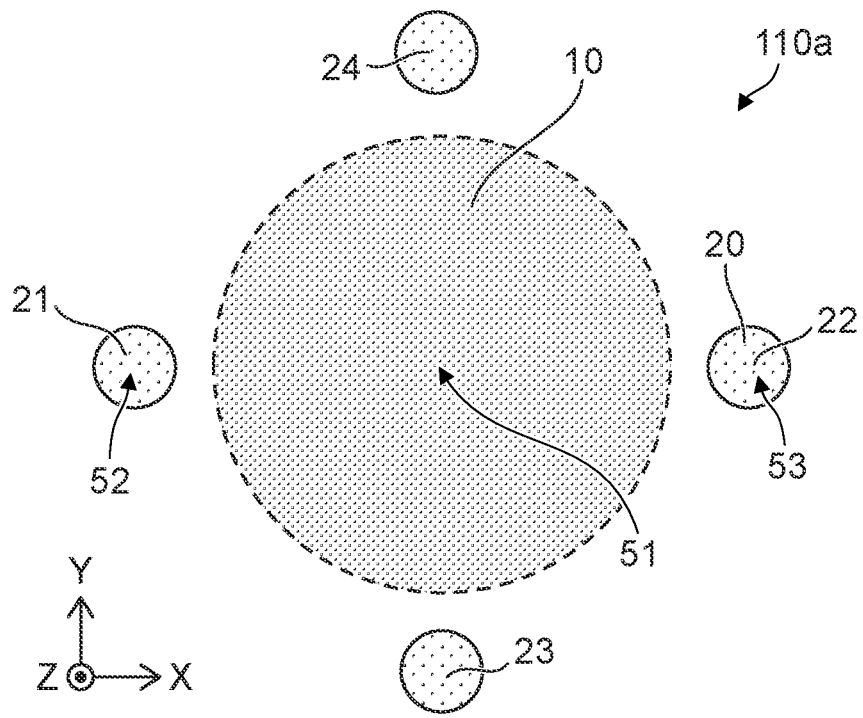
FIGS. 2A and 2B are schematic plan views illustrating radiation detectors according to the first embodiment.
Figure 2B:
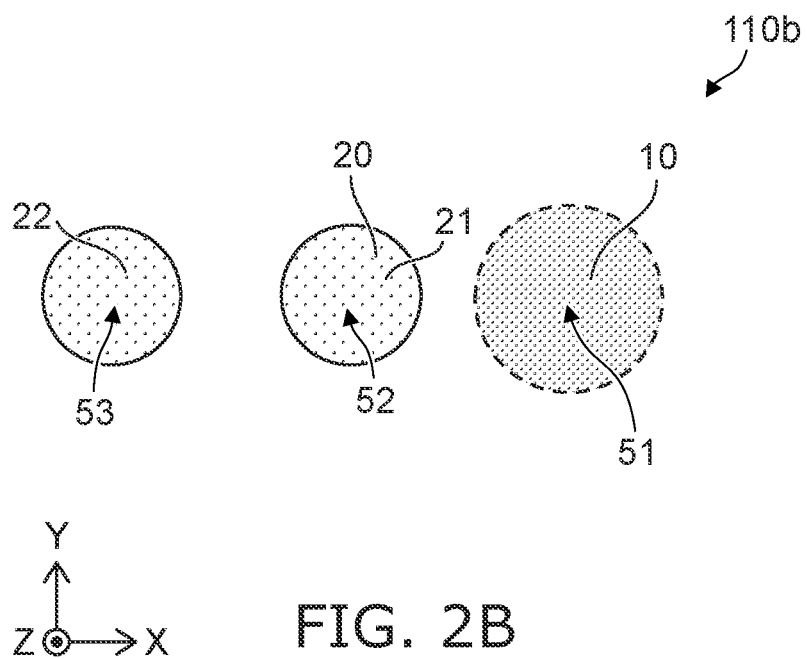

FIGS. 2A and 2B are schematic plan views illustrating radiation detectors according to the first embodiment.

The first radiation detection element 10 and the second radiation detection element 20 are illustrated in these drawings.

In a radiation detector 110a according to the embodiment as shown in FIG. 2A, the second radiation detection element 20 includes a third detecting part 23 and a fourth detecting part 24 in addition to the first detecting part 21 and the second detecting part 22. The direction from the third detecting part 23 toward the fourth detecting part 24 crosses the direction from the first detecting part 21 toward the second detecting part 22. The first to fourth detecting parts 21 to 24 may be discontinuous with each other.

In a radiation detector 110b according to the embodiment as shown in FIG. 2B, the second partial region 52 is between the third partial region 53 and the first partial region 51 in the first direction (the X-axis direction). The position in the X-axis direction of the first detecting part 21 is between the position in the X-axis direction of the second detecting part 22 and the position in the X-axis direction of the first radiation detection element 10.

In the radiation detectors 110a and 110b as well, the distance between the object 80 and the first radiation detection element is stable.

Examples of the first and second radiation detection elements 10 and 20 will now be described.

Figure 3:
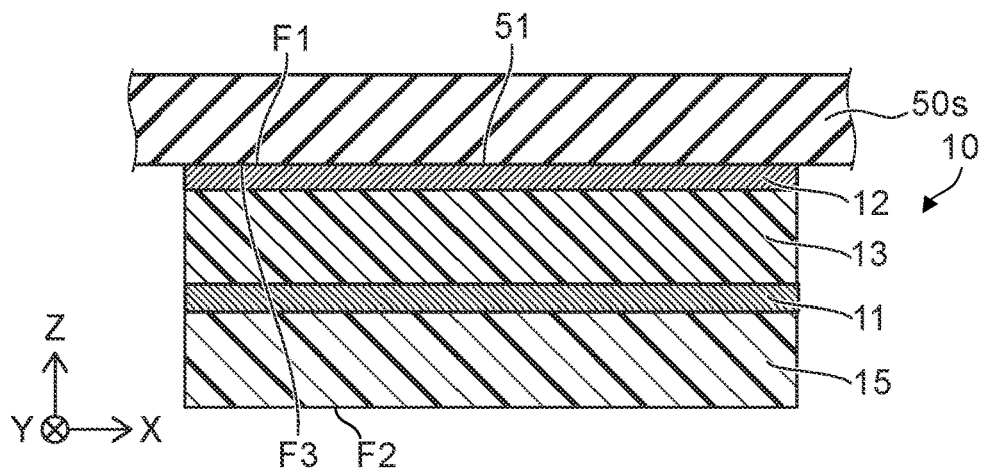
FIG. 3 is a schematic cross-sectional view illustrating a portion of the radiation detector according to the first embodiment.
Figure 4:
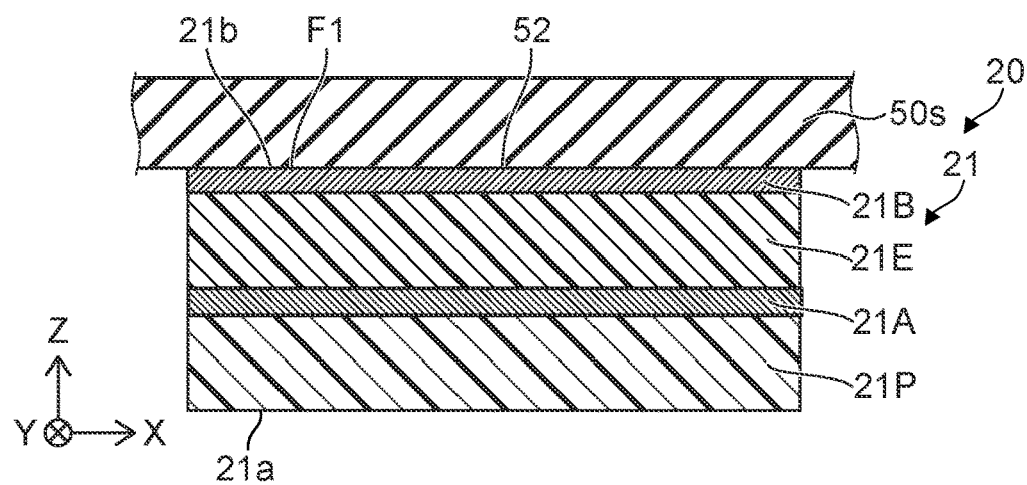
FIG. 4 is a schematic cross-sectional view illustrating a portion of the radiation detector according to the first embodiment.
Figure 5:
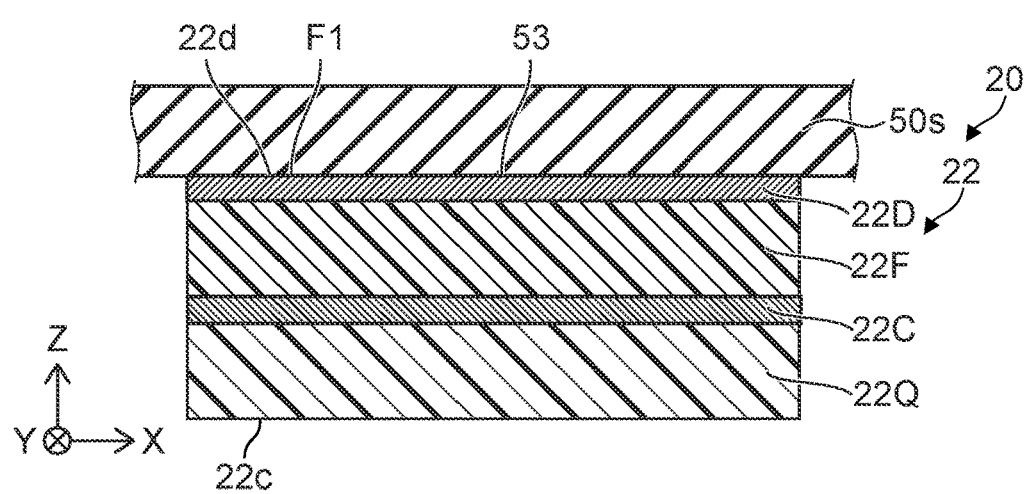
FIG. 5 is a schematic cross-sectional view illustrating a portion of the radiation detector according to the first embodiment.

FIGS. 3 to 5 are schematic cross-sectional views illustrating portions of the radiation detector according to the first embodiment.

As shown in FIG. 3, the first radiation detection element 10 includes, for example, a first electrode 11, a second electrode 12, and an organic semiconductor part 13. The second electrode 12 is located between the first electrode 11 and the first partial region 51. The organic semiconductor part 13 is located between the first electrode 11 and the second electrode 12. The first electrode 11 may be, for example, light-transmissive. The first electrode 11 may include, for example, an oxide of a metal (e.g., Sn, Zn, In, etc.). The second electrode 12 may be, for example, light-reflective.

In the example, the first radiation detection element 10 further includes a scintillator part 15. The first electrode 11 is between the scintillator part 15 and the organic semiconductor part 13. The radiation (e.g., the (β-rays) that is incident on the scintillator part 15 is converted into light (e.g., visible light) by the scintillator part 15. The light enters the organic semiconductor part 13 and is converted into an electrical signal by the organic semiconductor part 13. The radiation can be detected by detecting the electrical signal.

As shown in FIG. 4, the first detecting part 21 of the second radiation detection element 20 includes, for example, an organic semiconductor layer 21E. In the example, the organic semiconductor layer 21E is along the first direction (the X-axis direction). For example, the organic semiconductor layer 21E is along the X-Y plane. The first detecting part 21 includes a first conductive member 21A and a second conductive member 21B. The second conductive member 21B is located between the first conductive member 21A and the second partial region 52. The organic semiconductor layer 21E is located between the first conductive member 21A and the second conductive member 21B.

The first detecting part 21 may further include a scintillator layer 21P. The organic semiconductor layer 21E is between the scintillator layer 21P and the second partial region 52 in the second direction (the Z-axis direction). For example, the first conductive member 21A is between the scintillator layer 21P and the organic semiconductor layer 21E.

As shown in FIG. 5, the second detecting part 22 of the second radiation detection element 20 includes, for example, an organic semiconductor layer 22F. In the example, the organic semiconductor layer 22F is along the first direction (the X-axis direction). For example, the organic semiconductor layer 22F is along the X-Y plane. The second detecting part 22 includes a third conductive member 22C and a fourth conductive member 22D. The fourth conductive member 22D is located between the third conductive member 22C and the third partial region 53. The organic semiconductor layer 22F is located between the third conductive member 22C and the fourth conductive member 22D.

The second detecting part 22 may further include a scintillator layer 22Q. The organic semiconductor layer 22F is between the scintillator layer 22Q and the third partial region 53 in the second direction (the Z-axis direction). For example, the third conductive member 22C is between the scintillator layer 22Q and the organic semiconductor layer 22F.

The third conductive member 22C may be continuous with the first conductive member 21A. The fourth conductive member 22D may be continuous with the second conductive member 21B. The organic semiconductor layer 22F may be continuous with the organic semiconductor layer 21E. The scintillator layer 22Q may be continuous with the scintillator layer 21P.

Figure 6:
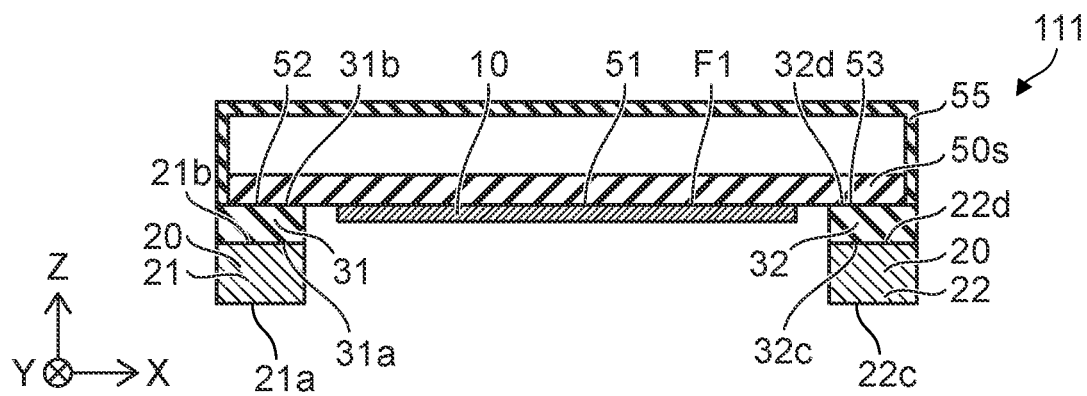
FIG. 6 is a schematic cross-sectional view illustrating a radiation detector according to the first embodiment.

FIG. 6 is a schematic cross-sectional view illustrating a radiation detector according to the first embodiment.

As shown in FIG. 6, the radiation detector 111 according to the embodiment further includes a first holding member 31. The configurations of the base body 50s, the first radiation detection element 10, and the second radiation detection element 20 of the radiation detector 111 may be similar to those of the radiation detectors 110, 110a, and 110b, etc. An example of the first holding member 31 will now be described.

The first holding member 31 includes a first fixing part 31a and a second fixing part 31b. The first fixing part 31a is configured to hold the first detecting part 21. The second fixing part 31b is fixable to the base body 50s. For example, the first holding member 31 functions as a fixing member that fixes the first detecting part 21. The first holding member 31 may function as a spacer.

As shown in FIG. 6, the radiation detector 111 according to the embodiment may further include a second holding member 32. The second holding member 32 includes a third fixing part 32c and a fourth fixing part 32d. The third fixing part 32c is configured to hold the second detecting part 22. The fourth fixing part 32d is fixable to the base body 50s. For example, the second holding member 32 functions as a fixing member that fixes the second detecting part 22. The second holding member 32 may function as a spacer.

For example, the fixation of the first holding member 31 and the second holding member 32 may include fixing by a combination of a protrusion and a recess, etc. For example, the fixation of the first holding member 31 and the second holding member 32 may include fixing by a screw, etc.

Second Embodiment

Figure 7:
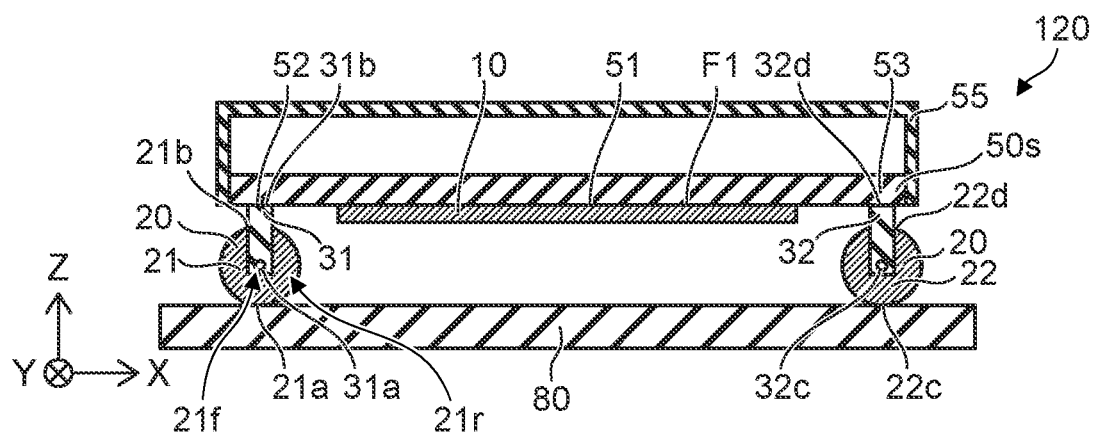
FIG. 7 is a schematic cross-sectional view illustrating a radiation detector according to a second embodiment.

FIG. 7 is a schematic cross-sectional view illustrating a radiation detector according to a second embodiment.

As shown in FIG. 7, the radiation detector 120 according to the embodiment includes the first holding member 31 in addition to the base body 50s, the first radiation detection element 10, and the second radiation detection element 20. The second holding member 32 is further provided in the example. The configurations of the base body 50s, the first radiation detection element 10, and the second radiation detection element 20 of the radiation detector 120 may be similar to those of the radiation detectors 110, 110a, and 110b, etc.

The first holding member 31 includes the first fixing part 31a and the second fixing part 31b. The first fixing part 31a holds the first detecting part 21. For example, the first detecting part 21 is rotatable. The first detecting part 21 is rotatable with a direction (in the example, the Y-axis direction) along the first surface F1 as the rotation axis.

The second holding member 32 includes the third fixing part 32c and the fourth fixing part 32d. The third fixing part 32c holds the second detecting part 22. The second detecting part 22 is, for example, rotatable. The second detecting part 22 is rotatable with a direction (in the example, the Y-axis direction) along the first surface F1 as the rotation axis.

By such a configuration, the radiation detector 120 is easily moved over the object 80.

For example, the first detecting part 21 includes a fixed part 21f, and an outer part 21r that has a ring shape around the fixed part 21f. The fixed part 21f is held by the first fixing part 31a. The outer part 21r is rotatable around the fixed part 21f.

In the radiation detector 120, the second partial region 52 may be between the third partial region 53 and the first partial region 51 in the first direction (the Z-axis direction).

Figure 8:
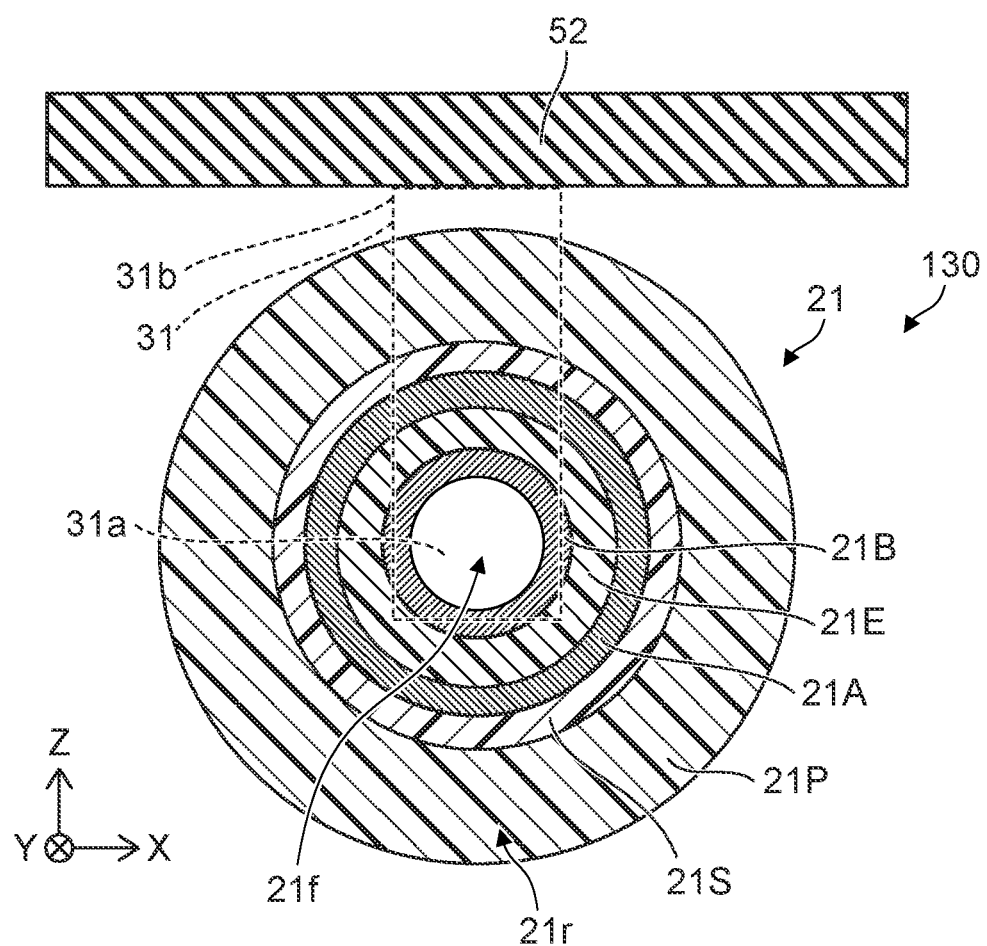
FIG. 8 is a schematic cross-sectional view illustrating a portion of the radiation detector according to the second embodiment.

FIG. 8 is a schematic cross-sectional view illustrating a portion of the radiation detector according to the second embodiment.

FIG. 8 illustrates the first detecting part 21. As shown in FIG. 8, the first detecting part 21 includes the organic semiconductor layer 21E. The organic semiconductor layer 21E is located around the fixed part 21f. For example, the second conductive member 21B is located around the fixed part 21f. The organic semiconductor layer 21E is located around the second conductive member 21B. The first conductive member 21A is located around the organic semiconductor layer 21E.

In the example, the first detecting part 21 includes the scintillator layer 21P. The scintillator layer 21P is located around the organic semiconductor layer 21E. In the example, a resin member 21S is located between the first conductive member 21A and the scintillator layer 21P. The resin member 21S is light-transmissive. The resin member 21S is a light-transmissive film. The scintillator layer 21P may include, for example, a resin. The scintillator layer 21P is, for example, a plastic scintillator.

The radiation detector 130 according to the embodiment (referring to FIG. 8) includes the first conductive member 21A, the second conductive member 21B, and the organic semiconductor layer 21E. The first conductive member 21A is located around the second conductive member 21B. The organic semiconductor layer 21E is located between the first conductive member 21A and the second conductive member 21B. The radiation detector 130 can detect radiation that is incident on the radiation detector 130 from various directions.

The radiation detector 130 may further include the scintillator layer 21P. The scintillator layer 21P is located around the first conductive member 21A. The radiation can be detected with higher sensitivity.

In the radiation detectors according to the first and second embodiments, the organic semiconductor part or the organic semiconductor layer includes, for example, a p-type semiconductor material and an n-type semiconductor material. In one example, the p-type semiconductor material may include, for example, P3HT (Poly(3-hexylthiophene)), etc. In one example, the n-type semiconductor material may include, for example, fullerene. The fullerene includes, for example, $PC_{61}BM$ ([6,6]-phenyl-$C_{61}$-butyric acid methyl ester). According to the embodiment, the photoelectric converter may include silicon, etc. By the photoelectric converter including the organic semiconductor part or the organic semiconductor layer, for example, the effects of other radiation such as γ-rays, etc., are easily suppressed when detecting β-rays.

The scintillator part 15 includes, for example, a material including at least one selected from the group consisting of polyvinyl toluene, polystyrene, and polymethyl methacrylate. The proportion of the material recited above that is included in the scintillator part 15 is greater than 50 weight % of the scintillator part 15. The scintillator part 15 is, for example, a plastic scintillator.

At least one of the scintillator layer 21P or the scintillator layer 22Q includes, for example, a material including at least one selected from the group consisting of polyvinyl toluene, polystyrene, and polymethyl methacrylate. The proportion of the material recited above that is included in the at least one of the scintillator layer 21P or the scintillator layer 22Q is greater than 50 weight % of one of these layers. The at least one of the scintillator layer 21P or the scintillator layer 22Q is, for example, a plastic scintillator.

At least one of the first conductive member 21A or the third conductive member 22C includes, for example, at least one selected from the group consisting of indium tin oxide, zinc oxide, tin oxide, titanium oxide, and graphene.

At least one of the second conductive member 21B or the fourth conductive member 22D includes, for example, at least one selected from the group consisting of aluminum, silver, and magnesium.

The first electrode 11 may include, for example, an oxide of a metal (e.g., Sn, Zn, In, etc.). The first electrode 11 may be, for example, light-transmissive.

The second electrode 12 includes, for example, at least one selected from the group consisting of aluminum, silver, and magnesium. The second electrode 12 may be, for example, light-reflective.

The resin member 21S includes, for example, at least one selected from the group consisting of polyethylene terephthalate, polyethylene naphthalate, polyethersulfone, cycloolefin polymer, and polyimide. For example, the polyimide is light-transmissive.

The base body 50s includes, for example, at least one selected from the group consisting of polyethylene terephthalate, polyethylene naphthalate, polyethersulfone, cycloolefin polymer, polyimide, and glass. For example, the polyimide is light-transmissive.

According to the embodiment, the object 80 may include a floor, a ceiling, a ground surface, a wall, etc.

Embodiments may include the following configurations (e.g., technological proposals).

Configuration 1

A radiation detector, comprising: a base body including a first surface, the first surface including a first partial region and a second partial region, a first direction from the first partial region toward the second partial region being along the first surface;

a first radiation detection element fixable to the first partial region; and a second radiation detection element including a first detecting part fixable to the second partial region, the first detecting part including a first end portion and a second end portion, a second direction from the first end portion toward the second end portion crossing the first surface, the second end portion being between the first end portion and the second partial region in the second direction, the first radiation detection element not overlapping the first end portion in the first direction.

Configuration 2

The radiation detector according to Configuration 1, wherein the first radiation detection element is recessed in the second direction when referenced to the first end portion.

Configuration 3

The radiation detector according to Configuration 1 or 2, wherein the base body further includes a third partial region, the second radiation detection element further includes a second detecting part, the second detecting part is fixable to the third partial region, the second detecting part includes a third end portion and a fourth end portion, a direction from the third end portion toward the fourth end portion is along the second direction, the fourth end portion is between the third end portion and the third partial region in the second direction, and the first radiation detection element does not overlap the third end portion in the first direction.

Configuration 4
The radiation detector according to Configuration 3, wherein
the first partial region is between the second partial region and the third partial region in the first direction.
Configuration 5
The radiation detector according to Configuration 4, wherein
the second detecting part is continuous with the first detecting part.
Configuration 6
The radiation detector according to any one of Configurations 3 to 4, wherein
the second radiation detection element has a ring shape having the second direction as a central axis.
Configuration 7
The radiation detector according to Configuration 3, wherein
the second partial region is between the third partial region and the first partial region in the first direction.
Configuration 8
The radiation detector according to any one of Configurations 1 to 7, wherein
the second radiation detection element is detachable from the base body.
Configuration 9
The radiation detector according to any one of Configurations 1 to 8, wherein
the first detecting part includes an organic semiconductor layer, and
the organic semiconductor layer is along the first direction.
Configuration 10
The radiation detector according to Configuration 9, wherein
the first detecting part further includes a scintillator layer, and
the organic semiconductor layer is between the scintillator layer and the second partial region in the second direction.
Configuration 11
The radiation detector according to any one of Configurations 1 to 7, further comprising:
a first holding member,
the first holding member including a first fixing part and a second fixing part,
the first fixing part being configured to hold the first detecting part,
the second fixing part is fixable to the base body.
Configuration 12
The radiation detector according to Configuration 11, wherein
the first fixing part holds the first detecting part, and
the first detecting part is rotatable with a direction along the first surface as a rotation axis.
Configuration 13
The radiation detector according to Configuration 11 or 12, wherein
the first detecting part includes:
a fixed part; and
an outer part having a ring shape around the fixed part,
the fixed part is held by the first fixing part, and
the outer part is rotatable around the fixed part.
Configuration 14
The radiation detector according to Configuration 13, wherein
the first detecting part includes an organic semiconductor layer, and
the organic semiconductor layer is located around the fixed part.
Configuration 15
The radiation detector according to Configuration 14, wherein
the first detecting part includes a scintillator layer, and
the scintillator layer is located around the organic semiconductor layer.
Configuration 16
The radiation detector according to any one of Configurations 1 to 15, wherein
the first radiation detection element includes:
a first electrode;
a second electrode provided between the first electrode and the first partial region; and
an organic semiconductor part provided between the first electrode and the second electrode.
Configuration 17
The radiation detector according to Configuration 16, wherein
the first radiation detection element further includes a scintillator part, and
the first electrode is between the scintillator part and the organic semiconductor part.
Configuration 18
The radiation detector according to any one of Configurations 1 to 17, wherein
the first radiation detection element includes a second surface and a third surface,
the third surface is between the second surface and the first partial region, and
a distance along the second direction between a position of the first end portion in the second direction and a position of the second surface in the second direction is not less than 2 mm and not more than 30 mm.
Configuration 19
A radiation detector, comprising:
a first conductive member;
a second conductive member, the first conductive member being located around the second conductive member; and
an organic semiconductor layer provided between the first conductive member and the second conductive member.
Configuration 20
The radiation detector according to Configuration 19, further comprising:
a scintillator layer,
the scintillator layer being located around the first conductive member.

According to embodiments, a radiation detector can be provided in which more accurate detection is possible.

In the specification, "a state of being electrically connected" includes a state in which multiple conductors contact each other and current flows between each of the multiple conductors. "A state of being electrically connected" includes a state in which another conductor is inserted between the multiple conductors and current flows between the multiple conductors.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in radiation detectors such as conductive members, electrodes, organic semiconductor materials, scintillators, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all radiation detectors practicable by an appropriate design modification by one skilled in the art based on the radiation detectors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A radiation detector, comprising:
a base body including a first surface, the first surface including a first partial region and a second partial region;
a first radiation detection element, a position of the first radiation detection element with respect to the first partial region being fixed; and
a second radiation detection element including a first detecting part, a position of the first detecting part with respect to the second partial region being fixed,
the first detecting part including a first end portion and a second end portion,
a second direction from the first end portion toward the second end portion crossing the first surface, and
the second end portion being between the first end portion and the second partial region in the second direction,
wherein the first radiation detection element is configured to be apart from a detection target object when the first end portion contacts the detection target object.

2. The radiation detector according to claim 1, wherein the first radiation detection element is recessed in the second direction referenced to the first end portion.

3. The radiation detector according to claim 1, wherein the first surface further includes a third partial region, the second radiation detection element further includes a second detecting part,
a position of the second detecting part with respect to the third partial region is fixed,
the second detecting part includes a third end portion and a fourth end portion,
a direction from the third end portion toward the fourth end portion is along the second direction,
the fourth end portion is between the third end portion and the third partial region in the second direction, and
the first radiation detection element is configured to be apart from the detection target object when the third end portion contacts the detection target object.

4. The radiation detector according to claim 3, wherein the first partial region is provided between the second partial region and the third partial region.

5. The radiation detector according to claim 4, wherein the second detecting part is continuous with the first detecting part.

6. The radiation detector according to claim 3, wherein the second radiation detection element has a ring shape having the second direction as a central axis.

7. The radiation detector according to claim 3, wherein the second partial region is between the third partial region and the first partial region.

8. The radiation detector according to claim 1, wherein the second radiation detection element is detachable from the base body.

9. The radiation detector according to claim 1, wherein the first detecting part includes an organic semiconductor layer, and
the organic semiconductor layer is along the first surface.

10. A radiation detector, comprising:
a base body including a first surface, the first surface including a first partial region and a second partial region;
a first radiation detection element, a position of the first radiation detection element with respect to the first partial region being fixed; and
a second radiation detection element including a first detecting part, a position of the first detecting part with respect to the second partial region being fixed,
the first detecting part including a first end portion and a second end portion,
a second direction from the first end portion toward the second end portion crossing the first surface,
the second end portion being between the first end portion and the second partial region in the second direction,
the first radiation detection element not overlapping the first end portion in a direction along the first surface, wherein
the first detecting part includes an organic semiconductor layer,
the organic semiconductor layer is along the first surface,
the first detecting part further includes a scintillator layer, and
the organic semiconductor layer is between the scintillator layer and the second partial region in the second direction.

11. A radiation detector, comprising:
a base body including a first surface, the first surface including a first partial region and a second partial region;
a first radiation detection element, a position of the first radiation detection element with respect to the first partial region being fixed;
a second radiation detection element including a first detecting part, a position of the first detecting part with respect to the second partial region being fixed; and
a first holding member,
the first detecting part including a first end portion and a second end portion,
a second direction from the first end portion toward the second end portion crossing the first surface,
the second end portion being between the first end portion and the second partial region in the second direction,
the first radiation detection element not overlapping the first end portion in a direction along the first surface,
the first holding member including a first fixing part and a second fixing part,
the first fixing part being configured to hold the first detecting part, and
a position of the second fixing part with respect to the base body being fixed.

12. The radiation detector according to claim 11, wherein
the first fixing part holds the first detecting part, and
the first detecting part is rotatable with a direction along the first surface as a rotation axis.

13. The radiation detector according to claim 11, wherein the first detecting part includes:
a fixed part; and
an outer part having a ring shape around the fixed part,
the fixed part is held by the first fixing part, and
the outer part is rotatable around the fixed part.

14. The radiation detector according to claim 13, wherein
the first detecting part includes an organic semiconductor layer, and
the organic semiconductor layer is located around the fixed part.

15. The radiation detector according to claim 14, wherein
the first detecting part includes a scintillator layer, and
the scintillator layer is located around the organic semiconductor layer.

16. A radiation detector, comprising:
a base body including a first surface, the first surface including a first partial region and a second partial region;
a first radiation detection element, a position of the first radiation detection element with respect to the first partial region being fixed; and
a second radiation detection element including a first detecting part, a position of the first detecting part with respect to the second partial region being fixed,
the first detecting part including a first end portion and a second end portion,
a second direction from the first end portion toward the second end portion crossing the first surface,
the second end portion being between the first end portion and the second partial region in the second direction,
the first radiation detection element not overlapping the first end portion in a direction along the first surface, wherein
the first radiation detection element includes:
a first electrode;
a second electrode provided between the first electrode and the first partial region; and
an organic semiconductor part provided between the first electrode and the second electrode.

17. The radiation detector according to claim 16, wherein
the first radiation detection element further includes a scintillator part, and
the first electrode is between the scintillator part and the organic semiconductor part.

18. A radiation detector, comprising:
a base body including a first surface, the first surface including a first partial region and a second partial region;
a first radiation detection element, a position of the first radiation detection element with respect to the first partial region being fixed; and
a second radiation detection element including a first detecting part, a position of the first detecting part with respect to the second partial region being fixed,
the first detecting part including a first end portion and a second end portion,
a second direction from the first end portion toward the second end portion crossing the first surface,
the second end portion being between the first end portion and the second partial region in the second direction,
the first radiation detection element not overlapping the first end portion in a direction along the first surface, wherein
the first radiation detection element includes a second surface and a third surface,
the third surface is between the second surface and the first partial region, and
a distance along the second direction between a position of the first end portion in the second direction and a position of the second surface in the second direction is not less than 2 mm and not more than 30 mm.

* * * * *